(12) United States Patent
Zhao

(10) Patent No.: US 12,407,351 B2
(45) Date of Patent: Sep. 2, 2025

(54) COUNTER SYSTEM AND METHOD OF DRIVING THE COUNTER SYSTEM WITH ZERO ACCUMULATED ERROR

(71) Applicant: MEDIATEK INC., Hsin-Chu (TW)

(72) Inventor: De-Hao Zhao, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 58 days.

(21) Appl. No.: 18/415,622

(22) Filed: Jan. 17, 2024

(65) Prior Publication Data

US 2025/0233593 A1 Jul. 17, 2025

(51) Int. Cl.
*H03K 21/00* (2006.01)
*H03K 21/40* (2006.01)
*H03K 23/00* (2006.01)

(52) U.S. Cl.
CPC ........... *H03K 23/005* (2013.01); *H03K 21/40* (2013.01)

(58) Field of Classification Search
CPC ...... H03K 23/005; H03K 21/40; H03K 23/66; H03K 23/667; H03K 21/406
See application file for complete search history.

(56) References Cited

U.S. PATENT DOCUMENTS

| | | | |
|---|---|---|---|
| 4,519,091 A * | 5/1985 | Chu | H03K 21/12 377/44 |
| 10,886,926 B1 * | 1/2021 | Nakama | G06F 1/06 |
| 2012/0161826 A1 * | 6/2012 | Aas | H03L 1/00 327/147 |

* cited by examiner

*Primary Examiner* — Tuan T Lam
(74) *Attorney, Agent, or Firm* — Winston Hsu

(57) ABSTRACT

A method of driving a counter system with zero accumulated error includes setting a counter frequency of a counter transmitter, setting an original time count string according to the counter frequency, setting a first time count string of the counter greater than the original time count string, setting a second time count string of the counter smaller than the original time count string, and accumulating at least one first time count string and at least one second time count string over N cycles for generating a transmitter time count string. N is greater than two. A real time string generated by the original time count string over the N cycles is equal to the transmitter time count string.

20 Claims, 4 Drawing Sheets

COUNTER SYSTEM AND METHOD OF DRIVING THE COUNTER SYSTEM WITH ZERO ACCUMULATED ERROR

BACKGROUND

With the rapid advancement of technologies, various operating systems are adopted to computer applications according to their standards. For example, an operating frequency of the advanced RISC machine (ARM) architecture is specified as 1 GHz. In order to align with a central processing unit (CPU) timeline, certain subsystems rely on the same system counter for performing their synchronizations. Typically, the system counter and other processors are operated in different clock domains. Therefore, digitally encoded bits can be used for communicating the system counter with other processors.

However, if the operating frequency is below 1 GHz and is not a factor of 1 GHz, quantization errors and timeline offsets may be introduced. Since the errors are accumulated over time, the severe counter deviation may occur. Further, a clock domain crossing (CDC) issue is still a problem. Currently, additional hardware may be introduced to mitigate the accumulated error and the CDC issue. As a result, additional hardware space and high power consumption are unavoidable. Therefore, developing a counter system with zero accumulated error for different clock domains is an important issue.

SUMMARY

In an embodiment of the present invention, a method of driving a counter system with zero accumulated error is disclosed. The method comprises setting a counter frequency of a counter transmitter, setting an original time count string according to the counter frequency, setting a first time count string of the counter greater than the original time count string, setting a second time count string of the counter smaller than the original time count string, and accumulating at least one first time count string and at least one second time count string over N cycles for generating a transmitter time count string. N is greater than two. A real time string generated by the original time count string over the N cycles is equal to the transmitter time count string.

In another embodiment of the present invention, a counter system with zero accumulated error is disclosed. The counter system comprises a counter transmitter and a counter receiver. The counter transmitter comprises a counter module and a bit truncating module coupled to the counter module. The counter receiver comprises a digital decoder coupled to the digital encoder of the counter transmitter and a bit compensation module coupled to the digital decoder. The counter transmitter sets a counter frequency. The counter transmitter sets an original time count string according to the counter frequency. The counter transmitter sets a first time count string of the counter greater than the original time count string. The counter transmitter sets a second time count string of the counter smaller than the original time count string. The counter module accumulates at least one first time count string and at least one second time count string over N cycles for generating a transmitter time count string. N is greater than two. A real time string generated by the original time count string over the N cycles is equal to the transmitter time count string.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
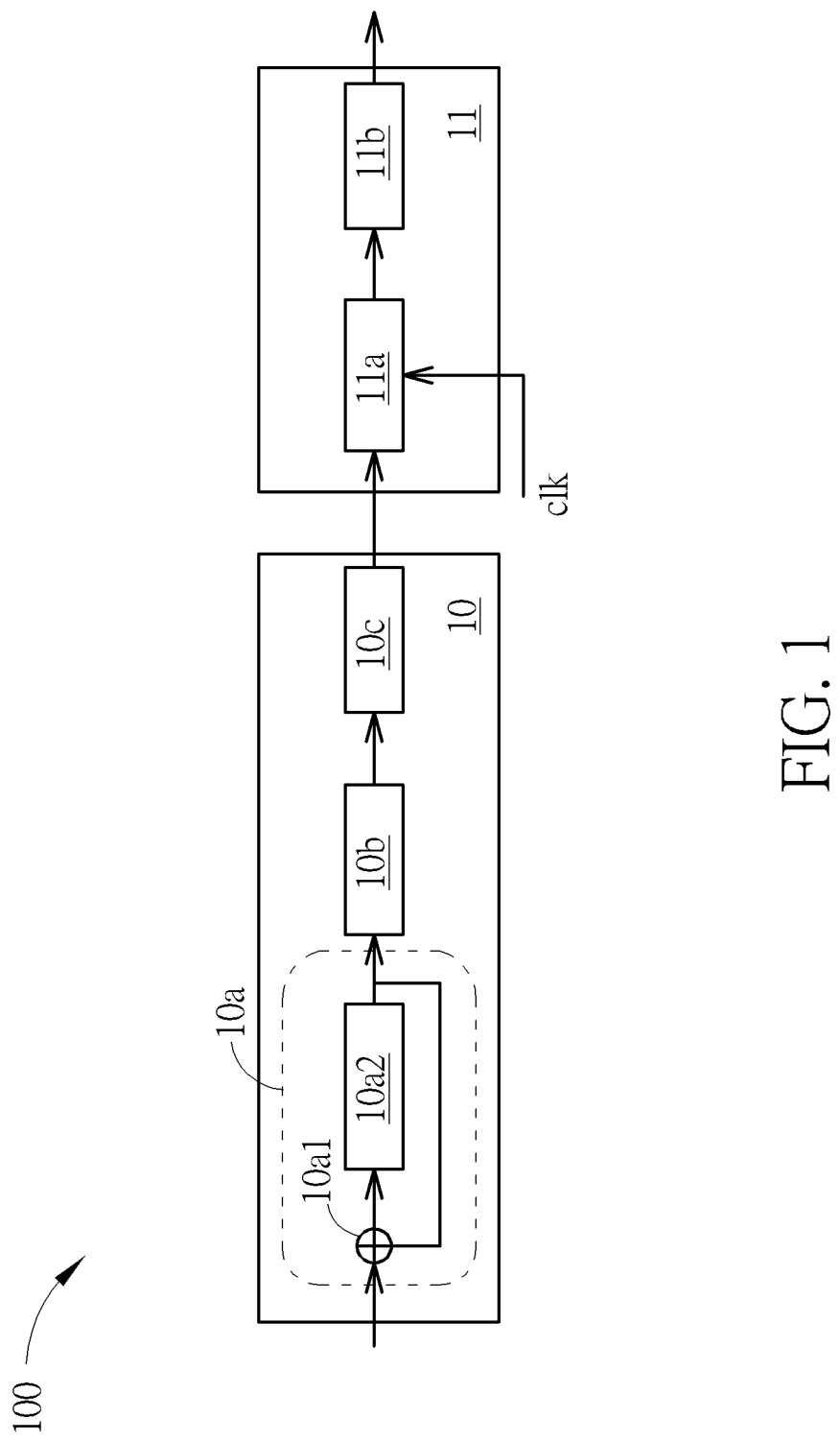
FIG. 1 is a block diagram of a counter system with zero accumulated error according to an embodiment of the present invention.

FIG. 1 is a block diagram of a counter system 100 with zero accumulated error according to an embodiment of the present invention. The counter system 100 includes a counter transmitter 10 and a counter receiver 11. The counter transmitter 10 includes a counter module 10a, a bit truncating module 10b, and a digital encoder 10c. The counter module 10a includes an adder 10a1 and a counter 10a2. The adder 10a1 is coupled to the counter 10a2 in a closed-loop feedback manner. The bit truncating module 10b is coupled to the counter module 10a. The digital encoder 10c is coupled to the bit truncating module 10b. The counter receiver 11 includes a digital decoder 11a and a bit compensation module 11b. The digital decoder 11a is coupled to the digital encoder 10c of the counter transmitter 10. The bit compensation module 11b is coupled to the digital decoder 11a. In the counter system 100, the counter transmitter 10 sets a counter frequency. The counter transmitter 10 sets an original time count string according to the counter frequency. The counter transmitter 10 sets a first time count string of the counter greater than the original time count string. The counter transmitter 10 sets a second time count string of the counter smaller than the original time count string. The counter module 10a accumulates at least one first time count string and at least one second time count string over N cycles for generating a transmitter time count string. Here, N is greater than two. A real time string generated by the original time count string over the N cycles is equal to the transmitter time count string. Since the real time string is equal to the transmitter time count string over the N cycles, no accumulated error is introduced to the counter system 100. Details of driving the counter system 100 are illustrated below.

Figure 2:
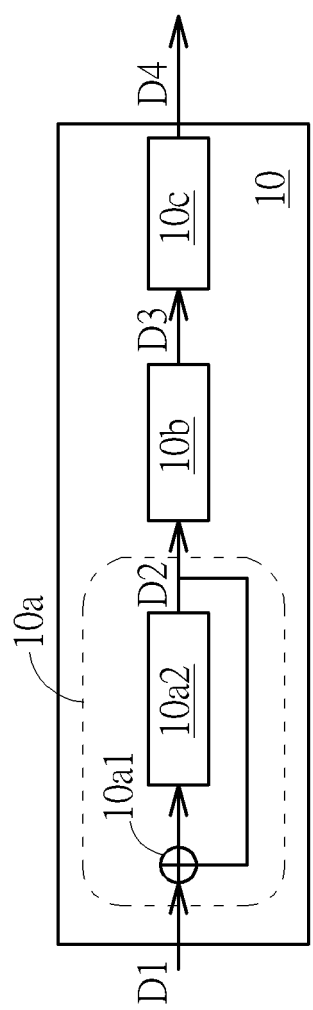
FIG. 2 is an illustration of data flow of a counter transmitter of the counter system in FIG. 1.

FIG. 2 is an illustration of data flow of the counter transmitter 10 of the counter system 100. As previously mentioned, the counter transmitter 10 sets the counter frequency. For example, an operating frequency of an advanced RISC machine (ARM) architecture is specified as 1 GHz. The counter frequency can be set as 13 MHZ (Hertz). Then, the counter transmitter 10 can set the original time count string according to the counter frequency. For example, the original time count string corresponding to 1000/13=76.92 ns (nanosecond) can be set. Here, the original time count string is a floating value. Then, the counter transmitter 10 sets the first time count string of the counter greater than the original time count string. The counter transmitter 10 sets the second time count string of the counter smaller than the original time count string. For example, the first time count string can be a ceiling function output of the original time count string. As a result, the first time count string can be set as 77 (decimal expression). The second time count string can be a floor function output of the original time count string. As a result, the second time count string can be set as 76 (decimal expression). In FIG. 2, input data D1 includes at least one first time count string and at least one second time count string over N cycles. By using the adder 10a1 and the counter 10a2, at least one first time count string and at least one second time count string can be accumulated for generating the transmitter time count string D2 over time. For example, at least one first time count string and at least one second time count string can be accumulated for generating 64 binary-bit transmitter time count string D2. Here, 64 binary bits can be used for ensuring that a maximum time count can be expressed as the transmitter time count string D2 (i.e., smaller than 64 binary bits).

In the counter system 100, since the first time count string (77) and the second time count string (76) can be regarded as two binary string values for approaching 76.92, at least one first time count string (77) and at least one second time count string (76) can be accumulated for approaching the real time string generated by the original time count string (i.e., 76.92) over the N cycles, such as 76.92×N. The N cycles, the transmitter time count string D2, the input data D1, the real time string, and the timing error can be expressed as Table T1.

TABLE T1

| Cycle (N) | transmitter time count string D2 (decimal expression) | input data D1 (decimal expression) | real time string (decimal expression) | timing error |
|---|---|---|---|---|
| 0 | 0 | 77 | 0 | 0 |
| 1 | 77 | 77 | 76.92307692 | 0.07692308 |
| 2 | 154 | 77 | 153.8461538 | 0.15384615 |
| 3 | 231 | 77 | 230.7692308 | 0.23076923 |
| 4 | 308 | 77 | 307.6923077 | 0.30769231 |
| 5 | 385 | 77 | 384.6153846 | 0.38461538 |
| 6 | 462 | 76 | 461.5384615 | 0.46153846 |
| 7 | 538 | 77 | 538.4615385 | −0.4615385 |
| 8 | 615 | 77 | 615.3846154 | −0.3846154 |
| 9 | 692 | 77 | 692.3076923 | −0.3076923 |
| 10 | 769 | 77 | 769.2307692 | −0.2307692 |
| 11 | 846 | 77 | 846.1538462 | −0.1538462 |
| 12 | 923 | 77 | 923.0769231 | −0.0769231 |
| 13 | 1000 | — | 1000 | 0 |

In Table T1, the real time string is equal to the transmitter time count string D2 over 13 cycles. Specifically, the timing error of the counter module 10a of the counter transmitter 10 in each cycle is a positive timing error or a negative timing error. For example, a timing error of a sixth cycle is 0.46153846. A timing error of a seventh cycle is −0.4615385. In Table T1, an accumulated error of the counter module 10a of the counter transmitter 10 over 13 cycles is zero.

In FIG. 2, the digital encoder 10c is a Gray code encoder. Therefore, to satisfy Gray code requirements, the bit truncating module 10b can be introduced to the counter transmitter 10. The bit truncating module 10b can truncate Q least significant bits (LSB) of the transmitter time count string D2 for generating the truncated transmitter time count string D3. $2^Q$ is greater than a decimal value of the first time count string. For example, the decimal value of the first time count string is equal to 77. Q can be set as seven for satisfying $2^7=128>77$. Then, when the transmitter time count string D2 has 64 bits, the bit truncating module 10b can truncate 7 LSB bits of the transmitter time count string D2 for generating the truncated transmitter time count string D3 having 57 bits. Then, the digital encoder 10c can encode the truncated transmitter time count string D3 for generating an encoded transmitter time count string D4. Particularly, since the digital encoder 10c is the Gray code encoder, a coding rate of the Gray code encoder is one. Therefore, the encoded transmitter time count string D4 has 57 bits.

In the counter system 100, since $2^Q$ is greater than the decimal value of the first time count string (i.e., 77), after the transmitter time count string D2 is truncated Q LSB bits, a Hamming distance of two encoded transmitter time count strings D4 over two consecutive cycles is smaller than or equal to one. Therefore, a code word set of the encoded transmitter time count strings D4 satisfies the condition of Gray code. As a result, the Gray code encoding mechanism can be achieved by the counter transmitter 10 of the counter system 100.

Figure 3:
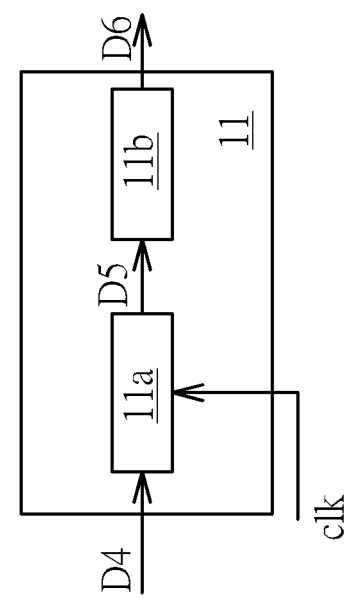
FIG. 3 is an illustration of data flow of a counter receiver of the counter system in FIG. 1.

FIG. 3 is an illustration of data flow of the counter receiver 11 of the counter system 100. As previously mentioned, the encoded transmitter time count string D4 is a Gray code word. Thus, the digital decoder 11a of the counter receiver 11 can be introduced. The digital decoder 11a can decode the encoded transmitter time count string D4 for generating a decoded receiver time count string D5. The digital decoder 11a is a Gray code decoder. For example, the encoded transmitter time count string D4 having 57 bits can be decoded by the digital decoder 11a for generating the decoded receiver time count string D5 having 57 bits. Then, the bit compensation module 11b can pad Q zero bits to the decoded receiver time count string D5 for generating a receiver time count compensation string D6. For example, the bit compensation module 11b can pad 7 zero bits to the decoded receiver time count string D5 having 57 bits for generating the receiver time count compensation string D6 having 64 bits. As a result, a bit length of the receiver time count compensation string D6 is equal to the transmitter time count string D4 (i.e., such as 64 bits).

In the counter system 100, although the encoded transmitter time count string D4 slightly sacrifices the accuracy of aligning the timeline in each cycle, a clock domain crossing (CDC) issue can be solved by performing the Gray code mechanism since the condition of the Gray code can be satisfied. Further, an accumulated error of the counter receiver over the M cycles is still zero. M is greater than two. For simplicity, the M cycles, the encoded transmitter time count string D4, the decoded receiver time count string D5, the real time string, and the timing error can be expressed as Table T2.

TABLE T2

| Cycle (M) | encoded transmitter time count string D4 (decimal expression/128) | decoded receiver time count string D5 (decimal expression) | real time string (decimal expression) | timing error |
|---|---|---|---|---|
| 0 | 0 | 0 | 0 | 0 |
| 1 | 0 | 0 | 76.92307692 | −76.9231 |
| 2 | 1 | 128 | 153.8461538 | −25.8462 |
| 3 | 1 | 128 | 230.7692308 | −102.769 |
| 4 | 2 | 256 | 307.6923077 | −51.6923 |
| 5 | 3 | 384 | 384.6153846 | −0.61538 |
| 6 | 3 | 384 | 461.5384615 | −77.5385 |
| . | . | . | . | . |
| . | . | . | . | . |
| . | . | . | . | . |
| 204 | 122 | 15616 | 15692.30769 | −76.3077 |
| 205 | 123 | 15744 | 15769.23077 | −25.2308 |

TABLE T2-continued

| Cycle (M) | encoded transmitter time count string D4 (decimal expression/128) | decoded receiver time count string D5 (decimal expression) | real time string (decimal expression) | timing error |
|---|---|---|---|---|
| 206 | 123 | 15744 | 15846.15385 | −102.154 |
| 207 | 124 | 15872 | 15923.07692 | −51.0769 |
| 208 | 125 | 16000 | 16000 | 0 |

In Table T2, the real time string is equal to the decoded receiver time count string D5 over 208 cycles. A decimal value (timeline) of the receiver time count compensation string D6 is equal to a decimal value (timeline) of the decoded receiver time count string D5 since the receiver time count compensation string D6 is generated by padding the Q zero bits to Q LSB bit addresses of the decoded receiver time count string D5. Specifically, the timing error of the counter receiver 11 in each cycle is a positive timing error or a negative timing error. In Table T2, an accumulated error of the counter receiver 11 over 208 cycles is zero. Further, since the encoded transmitter time count string D4 has 57 bits, it implies that 7 truncated bits may cause information loss. As a result, the maximum absolute timing error of the counter receiver 11 in each cycle is smaller than $2^Q$ (ns), such as $2^7=128$ (ns). However, no accumulated error is introduced to the counter transmitter 10 and the counter receiver 11 of the counter system 100.

Figure 4:
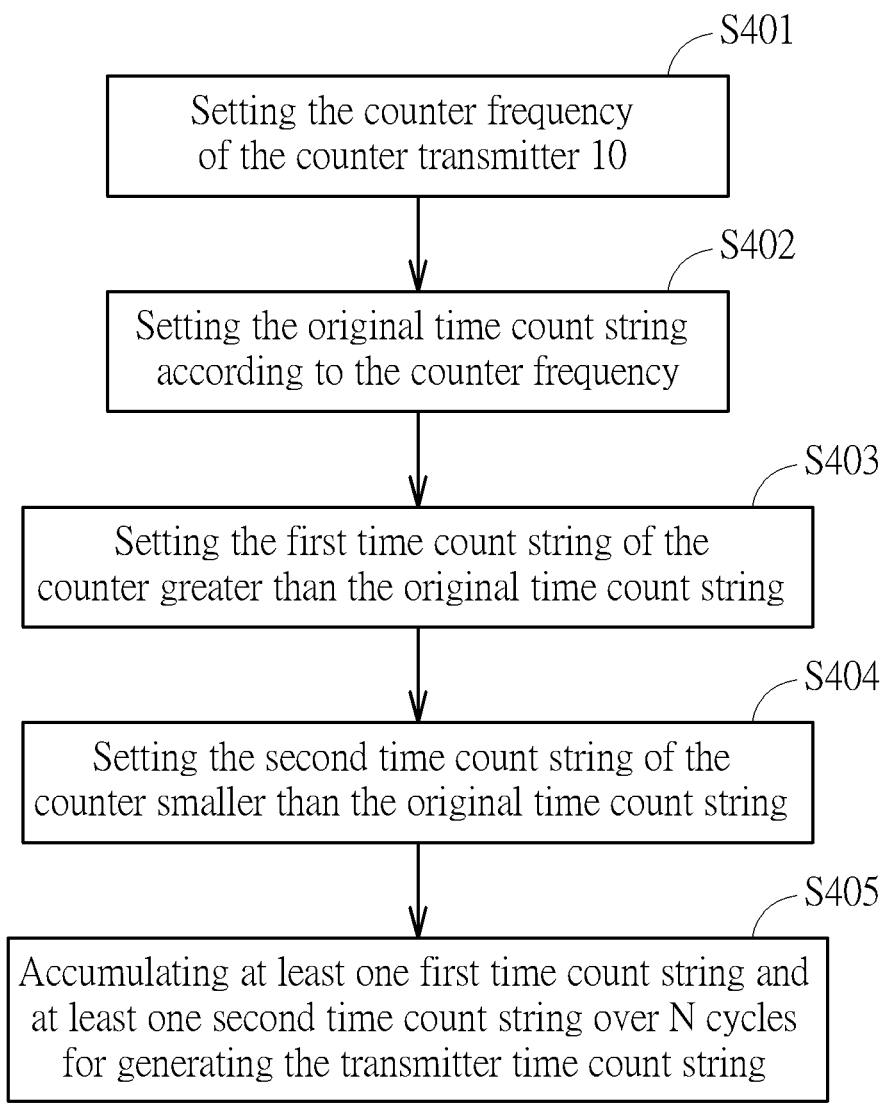
FIG. 4 is a flow chart of performing a method of driving the counter system in FIG. 1.

FIG. 4 is a flow chart of performing a method of driving the counter system 100. The method of driving the counter system 100 includes step S401 to step S405. Any technology or hardware modification falls into the scope of the present invention. Step S401 to step S405 are illustrated below.

step S401: setting the counter frequency of the counter transmitter 10;
step S402: setting the original time count string according to the counter frequency;
step S403: setting the first time count string of the counter greater than the original time count string;
step S404: setting the second time count string of the counter smaller than the original time count string;
step S405: accumulating at least one first time count string and at least one second time count string over N cycles for generating the transmitter time count string.

Details of step S401 to step S405 are previously illustrated. Thus, they are omitted here. In the counter system 100, since at least one first time count string and at least one second time count string are introduced. The timing error in each cycle is the positive timing error or the negative timing error. As a result, after at least one first time count string and at least one second time count string are accumulated over N cycles, an accumulated error of the counter system 100 can be completely removed. Thus, no error accumulation is introduced when the counter system 100 is performed over time.

To sum up, the present invention discloses a counter system with zero accumulated error. The counter system uses at least two different values for removing the accumulated timing error over several cycles. Although the positive timing error or the negative timing error may be introduced in each cycle, they are removed by each other over time. As a result, no error accumulation is introduced when the counter system is performed over time. Further, a Hamming distance of the two encoded transmitter time count strings over two consecutive cycles satisfies the condition of Gray code. The Gray code encoding mechanism can be achieved by the counter system. As a result, by using the counter system of the present invention, the clock domain crossing issue can be solved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of driving a counter system with zero accumulated error comprising:
   setting a counter frequency of a counter transmitter;
   setting an original time count string according to the counter frequency;
   setting a first time count string of the counter greater than the original time count string;
   setting a second time count string of the counter smaller than the original time count string; and
   accumulating at least one first time count string and at least one second time count string over N cycles for generating a transmitter time count string;
   wherein N is greater than two, a real time string generated by the original time count string over the N cycles is equal to the transmitter time count string.

2. The method of claim 1, wherein the first time count string is a ceiling function output of the original time count string, the second time count string is a floor function output of the original time count string, and the original time count string is a floating value.

3. The method of claim 1, wherein the transmitter time count string is generated in a form of P binary bits, and 2P is greater than the transmitter time count string.

4. The method of claim 1, wherein a timing error of the counter transmitter of the in each cycle is a positive timing error or a negative timing error, and an accumulated error of the counter transmitter over the N cycles is zero.

5. The method of claim 1, further comprising:
   truncating Q least significant bits (LSB) of the transmitter time count string for generating a truncated transmitter time count string; and
   encoding the truncated transmitter time count string by a digital encoder of the counter transmitter for generating an encoded transmitter time count string;
   where $2^Q$ is greater than a decimal value of the first time count string.

6. The method of claim 5, wherein a Hamming distance of two encoded transmitter time count strings over two consecutive cycles is smaller than or equal to one.

7. The method of claim 5, further comprising:
   decoding the encoded transmitter time count string by a digital decoder of a counter receiver for generating a decoded receiver time count string;
   wherein a decoding frequency of the counter receiver is equal to the counter frequency of the counter transmitter.

8. The method of claim 5, further comprising:
   padding Q zero bits to the decoded receiver time count string for generating a receiver time count compensation string;
   wherein a bit length of the receiver time count compensation string is equal to the transmitter time count string.

9. The method of claim 5, wherein a timing error of the counter receiver in each cycle is a positive timing error or a negative timing error, a maximum absolute timing error of the counter receiver in each cycle is smaller than $2^Q$, an accumulated error of the counter receiver over the M cycles is zero, and M is greater than two.

10. The method of claim 5, wherein the digital encoder is a Gray code encoder, and the digital decoder is a Gray code decoder.

11. A counter system with zero accumulated error comprising:
a counter transmitter comprising:
a counter module;
a bit truncating module coupled to the counter module; and
a digital encoder coupled to the bit truncating module; and
a counter receiver comprising:
a digital decoder coupled to the digital encoder of the counter transmitter; and
a bit compensation module coupled to the digital decoder;
wherein the counter transmitter sets a counter frequency, the counter transmitter sets an original time count string according to the counter frequency, the counter transmitter sets a first time count string of the counter greater than the original time count string, the counter transmitter sets a second time count string of the counter smaller than the original time count string, the counter module accumulates at least one first time count string and at least one second time count string over N cycles for generating a transmitter time count string, N is greater than two, a real time string generated by the original time count string over the N cycles is equal to the transmitter time count string.

12. The system of claim 11, wherein the first time count string is a ceiling function output of the original time count string, the second time count string is a floor function output of the original time count string, and the original time count string is a floating value.

13. The system of claim 11, wherein the transmitter time count string is generated in a form of P binary bits, and 2P is greater than the transmitter time count string.

14. The system of claim 11, wherein a timing error of the counter module of the counter transmitter in each cycle is a positive timing error or a negative timing error, and an accumulated error of the counter module of the counter transmitter over the N cycles is zero.

15. The system of claim 11, wherein the bit truncating module truncates Q least significant bits (LSB) of the transmitter time count string for generating a truncated transmitter time count string, the digital encoder encodes the truncated transmitter time count string for generating an encoded transmitter time count string, and $2^Q$ is greater than a decimal value of the first time count string.

16. The system of claim 15, wherein a Hamming distance of two encoded transmitter time count strings over two consecutive cycles is smaller than or equal to one.

17. The system of claim 15, wherein the digital decoder of a counter receiver decodes the encoded transmitter time count string for generating a decoded receiver time count string.

18. The system of claim 15, wherein the bit compensation module pads Q zero bits to the decoded receiver time count string for generating a receiver time count compensation string, and a bit length of the receiver time count compensation string is equal to the transmitter time count string.

19. The system of claim 15, wherein a timing error of the counter receiver in each cycle is a positive timing error or a negative timing error, a maximum absolute timing error of the counter receiver in each cycle is smaller than $2^Q$, an accumulated error of the counter receiver over the M cycles is zero, and M is greater than two.

20. The system of claim 15, wherein the digital encoder is a Gray code encoder, and the digital decoder is a Gray code decoder.

* * * * *